(12) United States Patent
Palanduz et al.

(10) Patent No.: US 7,290,315 B2
(45) Date of Patent: Nov. 6, 2007

(54) METHOD FOR MAKING A PASSIVE DEVICE STRUCTURE

(75) Inventors: Cengiz A. Palanduz, Chandler, AZ (US); Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/971,829

(22) Filed: Oct. 21, 2004

(65) Prior Publication Data
US 2006/0097246 A1 May 11, 2006

(51) Int. Cl.
*H01G 7/00* (2006.01)

(52) U.S. Cl. .................. 29/25.41; 29/25.42; 29/592.1; 427/79

(58) Field of Classification Search .......... 29/600, 29/602.1, 825, 830, 846, 852; 428/209, 416; 361/523–527, 311, 321.5; 174/252; 257/680, 257/737, 777–780; 216/36, 55, 63, 72; 427/96

See application file for complete search history.

(56) References Cited

U.S. PATENT DOCUMENTS

| | | | |
|---|---|---|---|
| 4,528,613 A | | 7/1985 | Stetson et al. |
| 4,687,540 A | | 8/1987 | Singhdeo et al. |
| 5,155,655 A | * | 10/1992 | Howard et al. ............. 361/303 |
| 5,172,304 A | * | 12/1992 | Ozawa et al. ............... 361/763 |
| 5,206,788 A | | 4/1993 | Larson et al. |
| 5,800,575 A | * | 9/1998 | Lucas ........................ 29/25.42 |
| 5,889,647 A | | 3/1999 | Hansen et al. |
| 5,978,207 A | | 11/1999 | Anderson et al. |
| 6,043,973 A | * | 3/2000 | Nagashima et al. ........ 361/305 |
| 6,226,172 B1 | * | 5/2001 | Sato et al. .................. 361/311 |

(Continued)

FOREIGN PATENT DOCUMENTS

EP  0977218 A2  2/2000

(Continued)

OTHER PUBLICATIONS

Ohly, C. et al., "Defects in alkaline earth titanate thin films—the conduction behavior of doped BST," Integrated Ferroelectrics, 2001, vol. 38, pp. 229-237.

(Continued)

*Primary Examiner*—Minh Trinh
(74) *Attorney, Agent, or Firm*—Blakely, Sokoloff, Taylor & Zafman LLP

(57) ABSTRACT

A method including forming a ceramic material directly on a sheet of a first conductive material; forming a second conductive material on the ceramic material; and sintering the ceramic material. A method including forming a ceramic material directly on a sheet of a first conductive material; forming a second conductive material on the ceramic material so that the ceramic material is disposed between the first conductive material and the second conductive material; thermal processing at a temperature sufficient to sinter the ceramic material and form a film of the second conductive material; and coating an exposed surface of at least one of the first conduct material and the second conductive material with a different conductive material. An apparatus including first and second electrodes; and a ceramic material between the first electrode and the second electrode, wherein the ceramic material is sintered directly on one of the first and second electrode.

18 Claims, 4 Drawing Sheets

U.S. PATENT DOCUMENTS

| | | | |
|---|---|---|---|
| 6,433,993 B1 | 8/2002 | Hunt et al. | |
| 6,437,970 B1 | 8/2002 | Lee et al. | |
| 6,477,034 B1 | 11/2002 | Chakravorty et al. | |
| 6,524,352 B2 * | 2/2003 | Adae-Amoakoh et al. | 29/25.03 |
| 6,541,137 B1 | 4/2003 | Kingon et al. | |
| 6,631,551 B1 | 10/2003 | Bowles et al. | |
| 6,638,378 B2 * | 10/2003 | O'Bryan et al. | 148/527 |
| 6,775,150 B1 | 8/2004 | Chakravorty et al. | |
| 6,795,296 B1 | 9/2004 | Palanduz et al. | |
| 6,980,416 B2 * | 12/2005 | Sakaguchi et al. | 361/523 |
| 7,072,167 B2 * | 7/2006 | Borland | 361/302 |
| 2001/0019144 A1 | 9/2001 | Roy | |
| 2001/0054748 A1 | 12/2001 | Wikborg et al. | |
| 2003/0136997 A1 | 7/2003 | Shioga et al. | |
| 2003/0184953 A1 | 10/2003 | Lee et al. | |
| 2004/0126484 A1 | 7/2004 | Croswell et al. | |
| 2005/0011857 A1 | 1/2005 | Borland et al. | |
| 2005/0118482 A1 | 6/2005 | Sriramulu et al. | |

FOREIGN PATENT DOCUMENTS

| | | |
|---|---|---|
| JP | 02-005507 | 1/1990 |
| JP | 07122456 | 12/1995 |
| JP | 2002-297939 | 10/2001 |

OTHER PUBLICATIONS

Ohly, C. et al., "High temperature conductivity behavior of doped SrTiO3 thin films," Integrated Ferroelectrics, 2001, vol. 33, pp. 363-372.

Ohly, C. et al., "Electrical conductivity and segregation effects of doped SrTiO3 thin films," Journal of European Ceramic Society, 21 (2001) 1673-1676.

Felten, J, et al.: Embedded Ceramic Resistors and Capacitors in PWB: Process and Performance, http://edc.ncms.org/ (2004) 7 pages.

Offerman, SE, et al.: "Grain Nucleation and Growth During Phase Transformations," Science (2002) 298:1003-1005.

PCT Search Report and Written Opinion for PCT Appln. No. PCT/US2005/037626, mailed May 8, 2006 (9 pages).

Office Action for U.S. Appl. No. 11/172,544, mailed Dec. 15, 2006 (12 pages).

Office Action for U.S. Appl. No. 10/974,139, mailed Dec. 13, 2006 (11 pages).

* cited by examiner

US 7,290,315 B2

METHOD FOR MAKING A PASSIVE DEVICE STRUCTURE

FIELD

Circuit structures and passive devices.

BACKGROUND

It is desirable to provide decoupling capacitance in a close proximity to an integrated circuit chip or die. The need for such capacitance increases as the switching speed and current requirements of chips or dies becomes higher. Thus, the need for a high number of passive components for high density integrated circuit chips or dies, the resultant increasing circuit density of printed wiring boards (PWB), and a trend to higher frequencies in the multi-gigaHertz range are among the factors combining to increase pressure on passive components surface-mounted on package substrates or PWBs. By incorporating embedded passive components (e.g., capacitors, resistors, inductors) into the package substrate or PWB, improved performance, better reliability, smaller footprint, and lower cost can be achieved.

Capacitors are the predominant passive component in most circuit designs. Typical materials for suitable embedded capacitor components, such as polymer and high-dielectric constant (high-k) ceramic powder composites or high-k ceramic powder and glass powder mixtures, are generally limited to a capacitance density on the order of nanoFarad/$cm^2$ and 0.1 microFarad/$cm^2$. Attempts have been made to embed thin film capacitors into organic substrates, such as utilizing ceramic fillers in polyimide or epoxy resins in thin laminate form. However, processing and handling of thin-core laminates has proved to be difficult.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Figure 1:
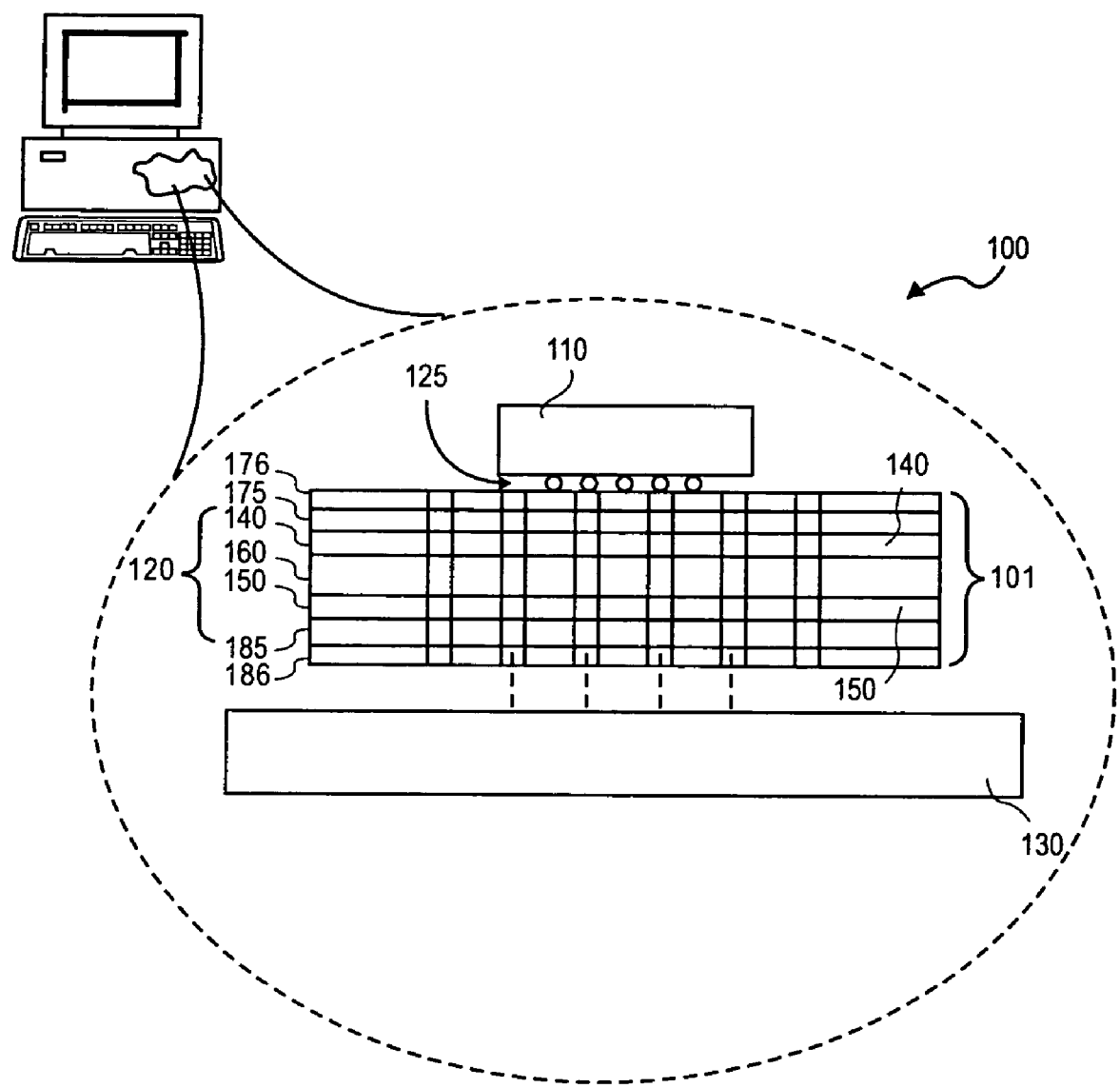
FIG. 1 shows a cross-sectional schematic side view of an embodiment of a chip or die package suitable for mounting on a printed circuit or wiring board.

FIG. 1 shows a cross-sectional side view of an integrated circuit package that can be physically and electrically connected to a printed wiring board or printed circuit board (PCB) to form an electronic assembly. The electronic assembly can be part of an electronic system such as a computer (e.g., desktop, laptop, hand-held, server, etc.), wireless communication device (e.g., cellular phone, cordless phone, pager, etc.), computer-related peripheral (e.g., printers, scanner, monitors, etc.), entertainment device (e.g., television, radio, stereo, tape and compact disc player, videocassette recorder, MP3 (Motion Picture Experts Group, Audio Layer 3) player, etc.), and the like. FIG. 1 illustrates the package as part of a desktop computer.

FIG. 1 shows electronic assembly 100 including die 110 physically and electrically connected to package substrate 101. Die 110 is an integrated circuit die, such as a processor die. Electrical contact points (e.g., contact pads on a surface of die 110) are connected to package substrate 101 through conductive bump layer 125. Package substrate 101 may be used to connect electronic assembly 100 to printed circuit board 130, such as a motherboard or other circuit board.

In one embodiment, package substrate 101 includes one or more capacitor structures. Referring to FIG. 1, package substrate 101 includes capacitor structure 140 and capacitor structure 150 embedded therein. Capacitor structure 140 and capacitor structure 150 are connected to opposite sides of core substrate 160. In one embodiment, core substrate 160 is an organic core such as an epoxy including a fiberglass reinforced material, also called pre-preg. This configuration may be referred to as an integrated thin film capacitor (iTFC) system, where the capacitor(s) is(are) integrated into the package substrate rather than, for example, an interposer between the die and the package substrate. Overlying capacitor structure 140 is adhesion layer 175 (e.g., a pre-preg material). Underlying capacitor structure 150 is adhesion layer 185. Overlying adhesion layer 175 is build-up layer 176. Underlying adhesion layer 185 is build-up layer 186. Adhesion layer 175 and adhesion layer 185 act as adhesion layers to the overlying and underlying build-up layers 176 and 186, respectively. Each build-up layer includes traces (e.g., copper traces) for lateral translation of contact points between die 110 and package substrate 101, and package substrate 101 and printed circuit board 130, respectively. The region made up of the combination of layers, 185, 150, 160, 140 and 175, is referred to herein as functional core 120.

Figure 2:
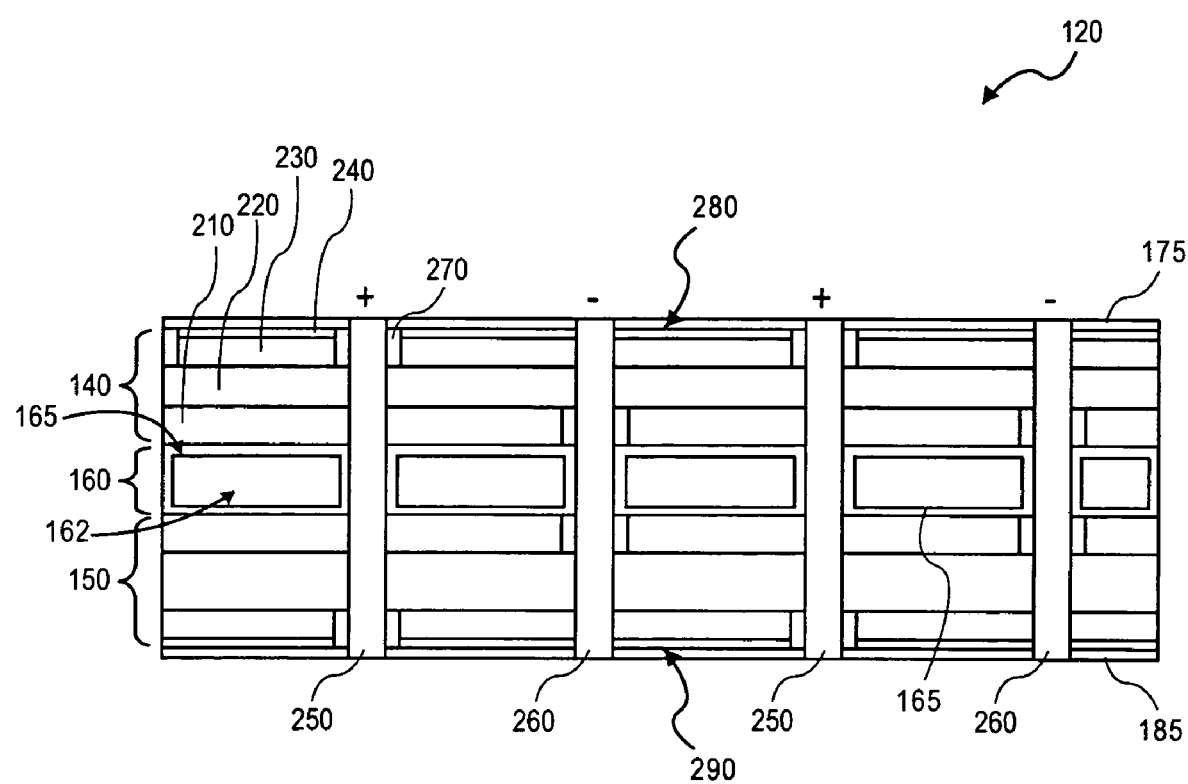
FIG. 2 shows a cross-sectional schematic side view of the package substrate of FIG. 1.

FIG. 2 shows a magnified view of a portion of functional core 120. Functional core 120 includes core substrate 160 and having a thickness, in one embodiment, on the order of 200 microns (μm) to 700 μm. In another embodiment, core substrate 160 has a thickness on the order of 200 μm to 300 μm. In one embodiment, core substrate 160 includes core 162, such as a glass-fiber reinforced epoxy, and shell 165, such as a silica-particle filled epoxy. In another embodiment, core substrate 160 includes only core 162.

Capacitor structure 140 is connected to one side of core substrate 160 (a top side as viewed). Capacitor structure 140 includes first conductor 210 proximal to core substrate 160 and second conductor 230. Disposed between first conductor 210 and second conductor 230 is dielectric material 220. Capacitor structure 150 is connected to an opposite side of core substrate 160 (a bottom side as viewed) and has a similar configuration of a dielectric material disposed between two conductors. Overlying capacitor structure 140 and capacitor structure 150 of functional core 120 (on sides opposite sides facing core substrate 160) is adhesion layer 175 and adhesion layer 185, respectively, made of, for example, an organic material and having a representative thickness on the order of 10 microns (μm) to 50 μm. Build-up layer 176 and build-up layer 186 of FIG. 1 would be deposited on these adhesion layers. As noted above, the build-up layers may include traces and contact points to connect package substrate to a chip or die and to a printed circuit board, respectively.

In one embodiment, first conductor 210 and second conductor 230 of capacitor structure 140 are electrically conductive material. Suitable materials include, but are not limited to, a nickel or a copper material. In one embodiment, dielectric material 220 is a ceramic material having a relatively high dielectric constant (high-k). Representatively, a high-k material is a ceramic material having a dielectric constant on the order of 100 to 1,000. Suitable materials for dielectric material 220 include, but are not limited to, barium titanate ($BaTiO_3$), barium strontium titanate (($Ba, Sr$) $TiO_3$), and strontium titanate ($SrTiO_3$).

In one embodiment, capacitor structure 140 includes first conductor 210 and second conductor 220 having a thickness on the order of 20 µm to 50 µm, and dielectric material 220 of a high-k ceramic material of a thickness on the order of 1 µm and, in another embodiment, less than 1 µm. Capacitor structure 150, in one embodiment, is similar to capacitor structure 140.

In the embodiment of functional core 120 shown in FIG. 2, capacitor structure 140 includes overlayer 240 on second conductor 230. Overlayer 240 is an optional electrically conductive layer that may be used in an instance where second conductor 230 is a material that may not be compatible or may be less compatible with materials or processing operations to which functional core 120 may be exposed. For example, in one embodiment, second conductor 230 is a nickel material. To render functional core 120 transparent to subsequent processing operations or compatible with materials to which functional core 120 may be exposed, overlayer 240 is a copper material. Representatively, overlayer 240, if present, may have a thickness on the order of a few microns.

FIG. 2 shows a number of conductive vias extending through functional core 120 between surface 280 and surface 290. Representatively, conductive via 250 and conductive via 260 are electrically conductive materials (e.g., copper or silver) of suitable polarity to be connected to power or ground contact points of die 110 (e.g., through conductive bump layer 125 to contact pads on die 110 of FIG. 1). In this manner, conductive via 250 and conductive via 260 extend through capacitor structure 140, core substrate 160, and capacitor structure 150. Conductive vias 250 and 260 may be insulated, where desired, from portions of capacitor structure 140 or capacitor structure 150 by sleeves 270 of a dielectric material.

Figure 3:
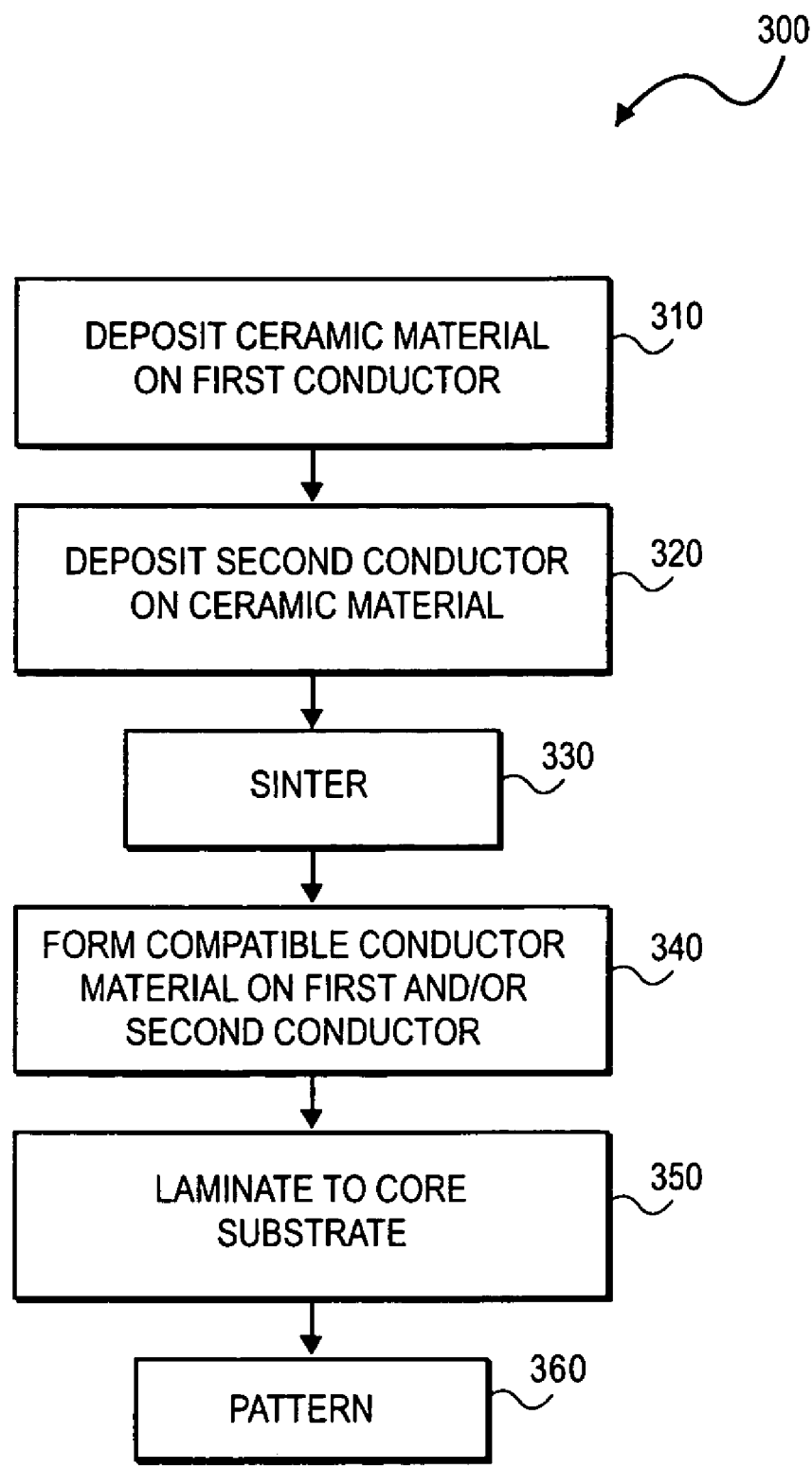
FIG. 3 describes a process flow for forming an embedded capacitor.

FIG. 3 presents a process for forming a package substrate, such as package substrate 120. In one embodiment, capacitor structure such as the capacitor structure 140 and capacitor structure 150 are formed and then separately connected to core substrate 160. FIGS. 4-8 show formation processes in connection with portions of the process flow described in FIG. 3, notably an embodiment of forming a capacitor structure.

In one embodiment of forming a capacitor structure of a package structure, a sheet (e.g., foil) of a first conductor material is provided as an initial substrate. Representatively, a sheet (e.g., foil) of nickel having a desired thickness is provided. Representative thickness are on the order of several microns to tens of microns depending on the particular design parameters. In one embodiment, the nickel sheet would be a standard rolled or plated nickel sheet. The dimensions of a sheet suitable as a first conductor may vary depending, for example, on the requirements of board shops involved in their production. For example, it may be desirable to process a sheet having a length and width dimension on the order of 200-400 millimeters from which a number of capacitor structures can be singulated. Individual capacitor could have sizes varying between silicon die dimensions to substrate dimensions.

Directly onto a surface of the first conductor, a ceramic material is deposited as a green sheet dielectric material (block 310). Representatively, ceramic powder particles may be deposited onto a surface, including an entire surface of a first conductor sheet or foil. In one embodiment, it is desired to form a dielectric layer of high-k material having a thickness on the order of one micron, ceramic powder particles having an average diameter on the order of 0.05 µm to 0.3 µm are deposited on the first conductor layer. In another embodiment, where a thickness of a dielectric layer is less than one micron, smaller ceramic powder particles are utilized. For example, to form a dielectric layer having a thickness on the order of 0.1 µm to 0.2 µm, grains having a grain size of 30 nanometers (nm) to 40 nm are appropriate.

Figure 4:
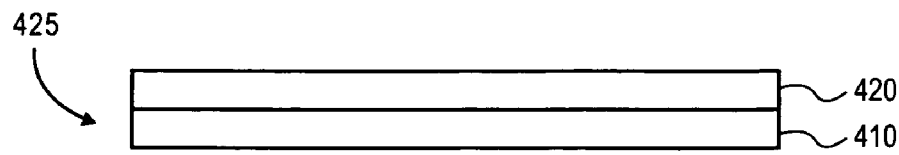
FIG. 4 shows a schematic side view of a first conductor sheet having a layer of conductive material formed thereon.

FIG. 4 shows structure 425 made up of a first conductor 410 of, for example, a nickel sheet or foil having layer 420 of nickel paste on a surface of first conductor 410 (a top surface as viewed). In one embodiment nickel paste layer 420 of FIG. 4 will have barium titanate powder additions in order to provide a adhesion layer between the underlying nickel foil and the soon-to-be-deposited overlying barium titanate green sheet.

Figure 5:
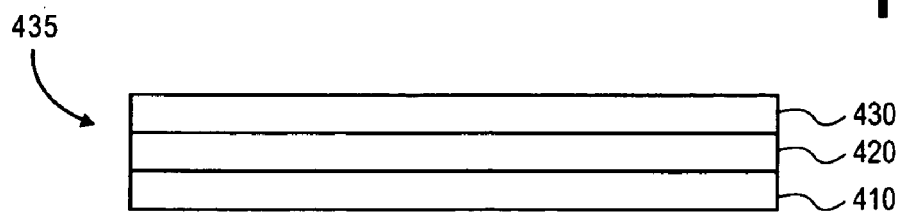
FIG. 5 shows a ceramic powder deposited on the first conductor sheet of FIG. 4.

FIG. 5 shows structure 435 with ceramic layer 430 having a high dielectric constant (e.g., $BaTiO_3$) deposited on structure 425. Ceramic layer 430 or green sheet in one embodiment is laminated on underlying Ni paste layer 420.

Figure 6:
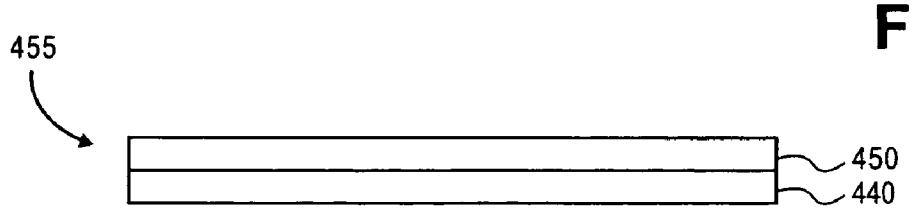
FIG. 6 shows a schematic side view of a second conductor sheet having a layer of conductive material formed thereon.

FIG. 6 shows structure 455 similar to structure 425 shown in FIG. 4, including second conductor (e.g., a nickel sheet or foil) 440 having layer 450 of nickel paste formed thereon. Nickel paste-nickel foil laminate 455 would be subsequently laminated on top (as viewed) of structure 435 in order to form structure 475 in FIG. 7. In one embodiment, following lamination, structure 475 is thermally treated to burn-off organic contents. Representatively, a thermal treatment would involve a temperature range of 300 to 500° C. for a duration of between two hours and a day.

Figure 7:
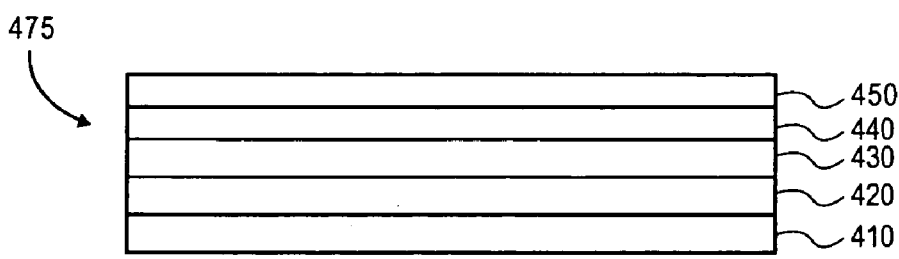
FIG. 7 shows the structure of FIG. 5 with the first conductor (FIG. 4) and the second conductor (FIG. 6) connected to opposite sides of a ceramic material.

Referring again to FIG. 3, following the formation of a high-k dielectric material between conductor materials, the composite structure is subsequently heat-treated in a reducing atmosphere in order to density (e.g., reduce the surface energy of) barium titanate green sheet and nickel paste layers simultaneously. Once this heat treatment is completed, the product will have sufficient strength for packaging and handling purposes, and will have sufficiently dense microstructure, with very little amount of porosity, resulting in a ceramic having a high dielectric constant. FIG. 7 shows composite structure 475 including ceramic layer 430 disposed between first conductor 410 and layer 420, and layer 440 and second conductor 450.

Figure 8:
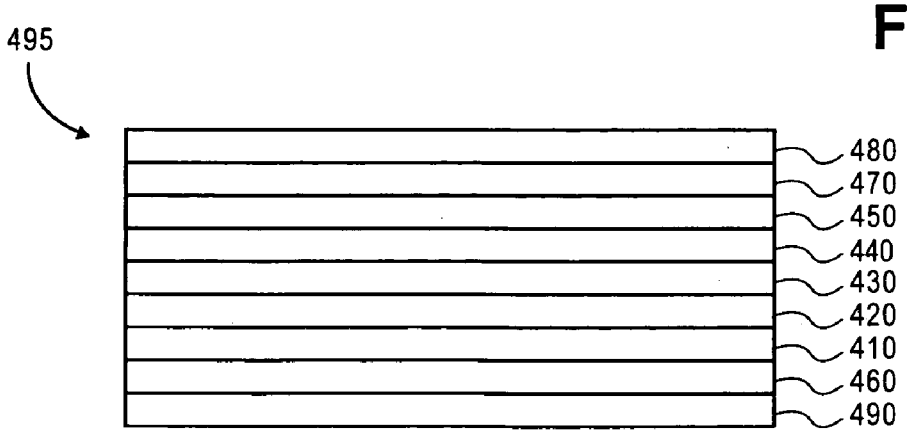
FIG. 8 shows the structure of FIG. 7 after sintering and having an overlay of conductor material on the first conductor and the second conductor.

Following heat treatment, the method of FIG. 3 provides that one or both of layer 410 and layer 440 are coated with a different electrically conductive material. FIG. 8 shows structure 495 where two copper layers have been deposited on top and bottom surfaces of the structure 475, respectively. Copper layer 460 and copper layer 470 are deposited, in one embodiment, through electroless deposition. Subsequent copper layers 480 and 490 are subsequently deposited on respective surfaces of copper layer 460 and copper layer 470 by electroplating. Copper overlayers 480 and 490 may have a thickness on the order of a few microns. Alternatively, a copper layer may be formed by depositing copper paste including copper particles and sintering the paste.

Copper coating may be desirable to make the capacitor structure transparent to subsequent processing operations to which the capacitor structure or the package substrate may be exposed. In the example where first conductor 410 and second conductor 450 are a nickel material, for example, it may be desirable to coat an exposed surface of the first or second conductor with a copper material.

Referring to technique or method 300 of FIG. 3, the capacitor structure may be attached to a core substrate, such as an organic core substrate as discussed above (block 350). In the example where a copper layer overlays a conductor, the copper surface may need to be roughened (e.g., by etching) in order to enhance lamination. The capacitor structure may be attached to one surface of the base substrate. A separate capacitor structure formed in a similar manner could be laminated to another surface, such as shown above in FIG. 2 and described in the accompanying text.

Following laminating of one or more capacitor structures to a core substrate, the package substrate may be patterned (block 360). Conventional patterning operations, such as mechanical drilling, drilling via holes in epoxy with laser, lithography and copper plating operations used in via formation may be employed. The capacitor structure may also be patterned to form individual capacitors. A complete organic substrate may be formed by adding build-up layers of an organic material (e.g., epoxy or glass particle-filled epoxy) onto the substrate.

The above description is related to forming capacitor structures within package substrates. Similar techniques may be used in the formation of capacitors in other environments, such as in printed wiring boards (e.g., printed circuit boards). The techniques described avoid a processing operation whereby ceramic and conductor powder pastes are deposited on carrier sheets and laminated to one another (such as in traditional manufacturing multi layer ceramic capacitors (MLCC). Instead, the ceramic and possibly both conductor materials are formed directly on one another.

In the preceding detailed description, reference is made to specific embodiments thereof. It will, however, be evident that various modifications and changes may be made thereto without departing from the broader spirit and scope of the following claims. The specification and drawings are, accordingly, to be regarded in an illustrative rather than a restrictive sense.

What is claimed is:

1. A method comprising:
   forming a ceramic material directly on a sheet of a first conductive material comprising a nickel foil material;
   forming a second conductive material on the ceramic material;
   sintering the ceramic material; then
   coating at least one of an exposed surface of the first conductive material and an exposed surface of the second conductive material with a copper material.

2. The method of claim 1, wherein the second conductive material is a paste and a condition for sintering the ceramic material converts the paste to a film.

3. The method of claim 1, wherein coating comprises plating the copper material.

4. The method of claim 1, wherein coating comprises depositing a copper paste comprising copper particles and sintering the copper particles in the paste.

5. The method of claim 1, wherein sintering the ceramic material comprises sintering in a reducing atmosphere.

6. The method of claim 1, wherein the second conductive material comprises a nickel paste material.

7. The method of claim 1, wherein the ceramic material has a thickness on the order of less than one micron.

8. The method of claim 1, further comprising plating nickel material to form the nickel foil material.

9. The method of claim 8, further comprising singulating the ceramic material, first conductive material, and second conductive material.

10. The method of claim 1, further comprising rolling nickel material to form the nickel foil material.

11. The method of claim 10, further comprising singulating the ceramic material, first conductive material, and second conductive material.

12. A method comprising:
    forming a ceramic material directly on a sheet of a first conductive material comprising a nickel foil material;
    forming a second conductive material on the ceramic material so that the ceramic material is disposed between the first conductive material and the second conductive material, wherein the first conductive material, the ceramic material, and the second conductive material comprise a composite structure;
    thermal processing at a temperature and a duration of time sufficient to sinter the ceramic material;
    coating an exposed surface of at least one of the first conductive material and the second conductive material with a different conductive material; and
    coupling the composite structure to an organic substrate.

13. The method of claim 12, wherein the different conductive material comprises copper and coating comprises plating the copper material.

14. The method of claim 12, wherein the composite structure is a first composite structure coupled to a first surface of the organic substrate and the method comprises coupling a second composite capacitor structure to an opposite second surface of the organic substrate.

15. The method of claim 12, wherein the second conductive material comprises a nickel paste material.

16. The method of claim 12, wherein the ceramic material has a thickness on the order of less than one micron.

17. A method comprising:
    forming a ceramic material directly on a sheet of a first conductive material comprising a nickel foil material;
    forming a second conductive material on the ceramic material; and
    sintering the ceramic material, wherein the first conductive material, the ceramic material, and the second conductive material comprise a composite structure and the method comprises coupling the composite structure to an organic substrate.

18. The method of claim 17, wherein the composite structure is a first composite structure coupled to a first surface of the organic substrate and the method comprises coupling a second composite capacitor structure to an opposite second surface of the organic substrate.

* * * * *